US008398812B2

(12) United States Patent
Kim et al.

(10) Patent No.: US 8,398,812 B2
(45) Date of Patent: Mar. 19, 2013

(54) APPARATUS AND METHOD FOR TREATING SUBSTRATES

(75) Inventors: Yi Jung Kim, Chungcheongnam-do (KR); Kyung Jin Seo, Chungcheongnam-do (KR); Chang Ro Yoon, Chungcheongnam-do (KR); Jung Keun Cho, Chungcheongnam-do (KR)

(73) Assignee: Semes Co. Ltd., Chungcheongnam-Do (KR)

( * ) Notice: Subject to any disclaimer, the term of this patent is extended or adjusted under 35 U.S.C. 154(b) by 1348 days.

(21) Appl. No.: 11/888,204

(22) Filed: Jul. 31, 2007

(65) Prior Publication Data
US 2008/0047580 A1 Feb. 28, 2008

(30) Foreign Application Priority Data
Aug. 24, 2006 (KR) .................. 10-2006-0080552

(51) Int. Cl.
C25F 5/00 (2006.01)
B08B 3/02 (2006.01)
(52) U.S. Cl. ................ 156/345.22; 156/345.33; 134/1.1
(58) Field of Classification Search .................... 134/1.1, 134/43, 94.1; 156/345.33, 345.34, 345.45, 156/345.46, 345.47, 345.44, 345.22
See application file for complete search history.

(56) References Cited

U.S. PATENT DOCUMENTS

| | | | |
|---|---|---|---|
| 2002/0007793 A1* | 1/2002 | Sakai et al. | 118/723 E |
| 2003/0113479 A1* | 6/2003 | Fukuda et al. | 427/569 |
| 2005/0230351 A1 | 10/2005 | Tahara | |
| 2005/0247667 A1* | 11/2005 | Kim et al. | 216/57 |
| 2008/0047580 A1* | 2/2008 | Kim et al. | 134/1.1 |
| 2008/0061035 A1* | 3/2008 | Kim | 216/67 |

FOREIGN PATENT DOCUMENTS

| | | |
|---|---|---|
| CN | 1664995 A | 9/2005 |
| CN | 1773681 A | 5/2006 |
| JP | 06-151302 | 5/1994 |
| JP | 06-037063 | 10/1994 |
| JP | 07-176399 A | 7/1995 |
| JP | 08-327959 | 12/1996 |
| JP | 2000-150475 | 5/2000 |
| JP | 2002-151480 | 5/2002 |
| JP | 2003-035962 A | 2/2003 |
| JP | 2004-273841 | 9/2004 |
| JP | 2005-322903 | 11/2005 |

(Continued)

OTHER PUBLICATIONS

English Translation of Abstract of KR20020078122 published Oct. 18, 2002.*
Taiwanese Office Action/Rejection corresponding to TW Patent Appl. No. 096131038 dated Mar. 10, 2011.

Primary Examiner — Sylvia R. MacArthur
(74) Attorney, Agent, or Firm — Jenkins, Wilson, Taylor & Hunt, P.A.

(57) ABSTRACT

A substrate treating apparatus for stripping photoresist on a substrate includes a support part for supporting the substrate, a dry-type treating part for stripping the photoresist on the substrate, and a wet-type treating part for stripping the photoresist on the substrate. While the substrate is supported by the support part, the photoresist on the substrate is primarily stripped by means of the dry-type treating part and secondarily stripped by means of the wet-type treating part. The dry-type treating part includes a plasma supply unit configured to supply plasma onto the substrate and a moving unit configured to vary a relative position of the plasma supply unit and the substrate.

15 Claims, 17 Drawing Sheets

FOREIGN PATENT DOCUMENTS

| | | |
|---|---|---|
| JP | 2006-019067 A | 1/2006 |
| KR | 10-1998-0005899 A | 3/1998 |
| KR | 10-2002-0078122 | 10/2002 |
| KR | 1020020078122 a * | 10/2002 |
| KR | 10-2004-0063920 A | 7/2004 |
| KR | 10-2006-0074492 A | 7/2006 |

* cited by examiner

APPARATUS AND METHOD FOR TREATING SUBSTRATES

CROSS-REFERENCE TO RELATED APPLICATIONS

This U.S non-provisional patent application claims priority under 35 U.S.C §119 of Korean Patent Application 2006-80552 filed on Aug. 24, 2006, the entirety of which is hereby incorporated by reference.

BACKGROUND

The present invention relates to substrate treating apparatus and method. More specifically, the present invention is directed to substrate treating apparatus and method using plasma.

A lithography process using a photoresist is necessary in semiconductor manufacturing. The photoresist is made of an organic high molecule that is sensitive to light or the mixture of a photosensitive agent and a high molecule. After being exposed and dissolved, the photoresist of a pattern formed on a substrate is used to transcribe the pattern onto the substrate while etching the substrate or layers formed on the substrate. Such a high molecule is called a photoresist, and a process of forming fine patterns on a substrate using a light source is called a lithography process.

In the semiconductor manufacturing process, the photoresist used to form lines or various fine circuit patterns (e.g., space pattern) or used as a mask during ion implantation is removed from a substrate by means of ashing.

The photoresist provided for preventing the injection of ions into portions except desired regions on a substrate is hardened during ion implantation. Therefore, it is difficult to strip the photoresist. In the case where the photoresist is not fully stripped, an electric short-circuit may occur between circuit wirings formed on the substrate because the hardened photoresist exhibits conductivity.

SUMMARY OF THE INVENTION

Exemplary embodiments of the present invention are directed to a substrate treating apparatus for stripping photoresist on a substrate. In an exemplary embodiment, the substrate treating apparatus may include: a support part for supporting the substrate such that a pattern surface of the substrate faces upwardly; a dry-type treating part for supplying plasma onto the substrate to primarily strip the photoresist on the substrate; and a wet-type treating part for supplying a chemical onto the substrate to secondarily strip the photoresist on the substrate.

Exemplary embodiments of the present invention are directed to a substrate treating method. In an exemplary embodiment, the substrate treating method may include: loading a substrate such that a pattern surface of the substrate faces upwardly; generating plasma by means of a plasma supply unit to primarily strip photoresist on the substrate; and supplying a chemical onto the substrate to secondarily strip the photoresist on the substrate.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

While a wafer W will be described below as an example of a substrate, it is not limited to the description herein.

Figure 1:
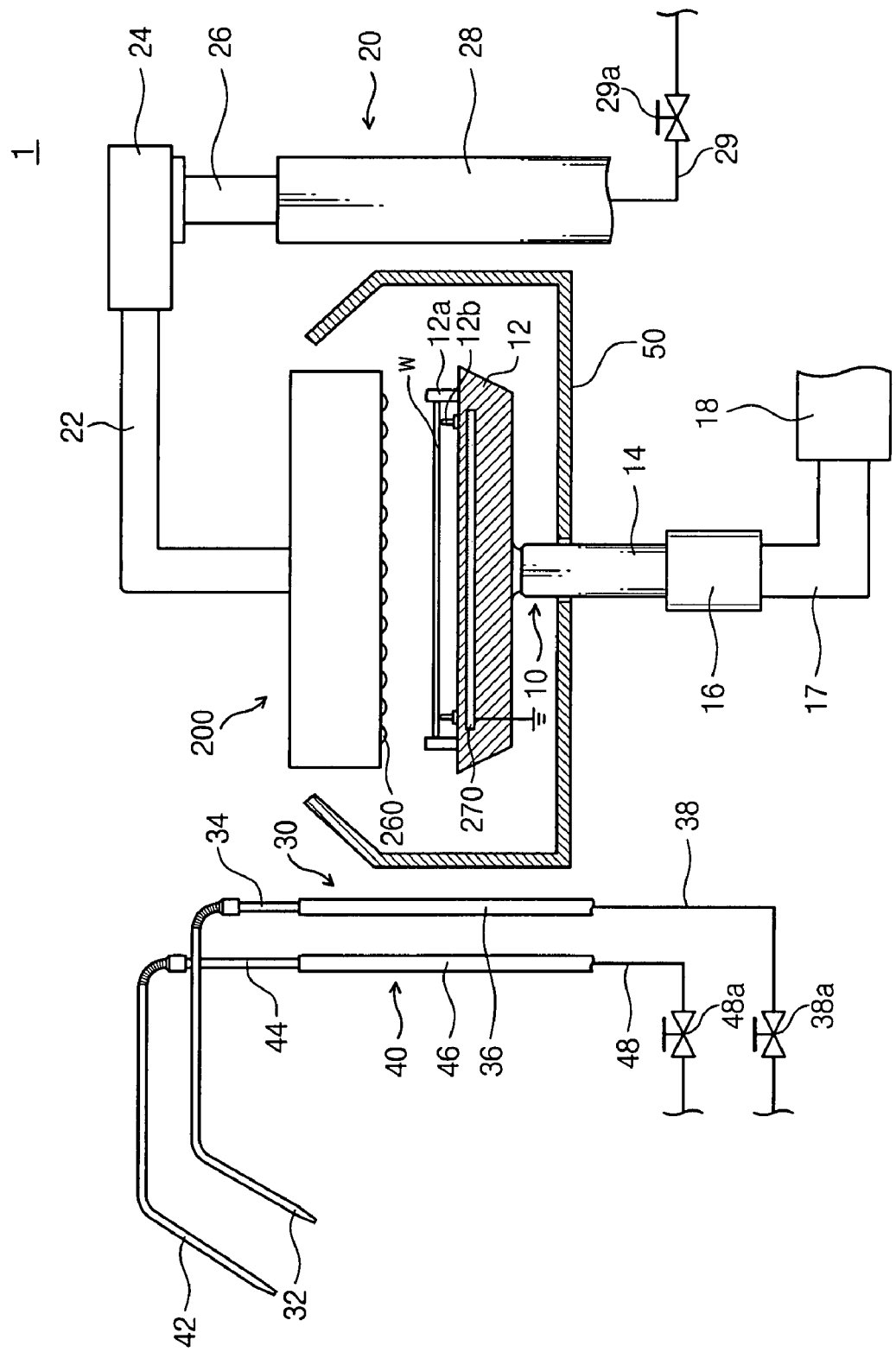
FIG. 1 illustrates a substrate treating apparatus according to a first embodiment of the present invention.

FIG. 1 illustrates a substrate treating apparatus 1 according to a first embodiment of the present invention. The substrate treating apparatus 1 includes a support part 10, a dry-type treating part 20, a wet-type treating part 30, a drying part 40, and a container 50.

The support part 10 is configured to support a wafer W such that a pattern surface of the wafer W faces upwardly. The support part 10 includes a plate 12 and a support shaft 14 connected to the bottom of the plate 12.

The plate 12 roughly exhibits the shape of a disk. A wafer W is loaded on the plate 12 to be stacked abreast. A plurality of chucking pins 12a and a plurality of support pins 12b are provided on the top surface of the plate 12. The chucking pins 12a are disposed at the edge of the plate 12 to support a side portion of the loaded wafer W, and the support pins 12b are disposed inside the chucking pins 12a to support the bottom of the loaded wafer W.

The support shaft 14 is connected to the bottom of the plate 12 to support the plate 12. The support shaft 14 is rotated by a first driver 16, which will be described later.

One side of the first driver 16 is connected to the bottom of the support shaft 14. As described above, the first driver 16 rotates the support shaft 14 using a motor or the like. The plate 12 and the wafer W are rotated by the support shaft 14. The rotation of the wafer W enables plasma and chemicals to be uniformly supplied onto the entire surface of the wafer W. The plasma and the chemicals will be described later.

The first driver 16 may elevate the plate 12 when a wafer W is loaded/unloaded on/from the plate 12 or there is a process requirement.

One end of a transfer arm 17 is connected to the other side of the first driver 16. The transfer arm 17 is L-shaped and has the other end connected to a second driver 18. The driver 18 may allow the transfer arm 17 to move left or right. When the transfer arm 17 moves left or right, the wafer W on the plate 12 also moves left or right. Since the wafer W may move relative to a fixed plasma supply unit 200, it may be treated by means of a scan method using a small-sized plasma supply unit 200. This will be described in detail later.

The dry-type treating part 20 is disposed at one side of the support part 10, treating a wafer W using plasma. The dry-type treating part 20 includes a first moving arm 22 and a second moving arm 26, which are configured to move the plasma supply unit 200. The plasma supply unit 200 will be described in detail later.

One end of the first moving arm 22 is connected to the top of the plasma supply unit 200. The first moving arm 22 is ㄱ-shaped and has the other end connected to the first moving arm 24. The first moving part 24 moves the first arm 22 left or light. When the first moving arm 22 moves left or right, the plasma supply unit 200 also moves left or right. Since the plasma supply unit 200 may move relative to the wafer W placed at a fixed portion, the wafer W may be treated by means of a scan method using a small-sized plasma supply unit 200. This will be described in detail later.

One end of the second moving arm 26 is connected to the bottom of the first moving part 24, and the other end thereof is connected to the second moving part 28. The moving part 28 may elevate and rotate the second moving part 26. Thus, a plasma generator 200 may travel to the top of the loaded wafer W and a distance between a first electrode 260 and a second electrode 270 may be controlled due to the elevation of the second moving arm 26.

A source gas line 29 is connected to the bottom end of the second moving part 28, supplying a source gas into a housing 200 through the insides of the second moving part 28, the second moving arm 26, the first moving part 24, and the first moving arm 22. The source gas line 29 is opened or closed by means of a source gas valve 29*a*.

The wet-type treating part 30 is disposed at the other side of the support part 10, treating a wafer W using chemicals. The wet-type treating part 30 includes a chemical nozzle 32 and a chemical nozzle moving arm 34.

The chemical nozzle 32 is configured to inject chemicals to the center of the wafer W on the plate 12. The chemical nozzle 32 extends from the top end of the chemical nozzle moving arm 32 to be parallel with the ground surface and is inclined at the tip downwardly toward the center of the wafer W.

The chemical nozzle moving arm 34 is horizontal to the ground surface and has the top to which the chemical nozzle 32 is connected and the bottom to which a chemical nozzle moving part 36 is connected. The chemical nozzle moving part 36 may elevate or rotate the chemical nozzle moving arm 34.

A chemical line 38 is connected to the bottom of the chemical nozzle moving part 36, supplying chemicals to the chemical nozzle 32 through the insides of the chemical nozzle moving part 36 and the chemical nozzle moving arm 34. The supplied chemicals are injected onto the wafer W through the chemical nozzle 32. The chemical line 38 is opened or closed by means of a valve 38*a* mounted on the chemical line 38.

The drying part 40 is disposed at the other side of the support part 10, drying a wafer W using a dry gas. The drying part 40 includes a dry nozzle 42 and a dry nozzle moving arm 44.

The dry nozzle 42 is configured to inject a dry gas to the center of the wafer W on the plate 12. The dry nozzle 42 extends from the top end of the dry nozzle moving arm 44 to be parallel with the ground surface and is inclined at the tip downwardly toward the center of the wafer W.

The dry nozzle moving arm 44 is horizontal to the ground surface and has the top to which the dry nozzle 42 is connected and the bottom to which a dry nozzle moving part 46 is connected. The dry nozzle moving part 46 may elevate or rotate the dry nozzle moving arm 44.

A dry gas line 48 is connected to the bottom of the dry nozzle moving part 46, supplying a dry gas to the dry nozzle 42 through the insides of the dry nozzle moving part 46 and the dry nozzle moving arm 44. The supplied dry gas is injected onto the wafer W through the dry nozzle 42. The dry gas line 48 is opened or closed by means of a valve 48*a* mounted on the dry gas line 48.

The container 50 is installed on the support shaft 14, surrounding the plate 12. Due to the rotating plate 12, chemicals on the wafer W may be dispersed during a process. The container 50 serves to prevent the dispersion of the chemicals on the wafer W. The container 50 includes a portion extending to be parallel with the ground surface, a portion extending to be perpendicular to the tip end, and a portion extending to be inclined upwardly from the top end. The upwardly extending portion is located as high as the wafer W on the plate 12. The chemicals dispersed from the wafer W flow downwardly through an inner wall of the upwardly extending portion.

Figure 2:
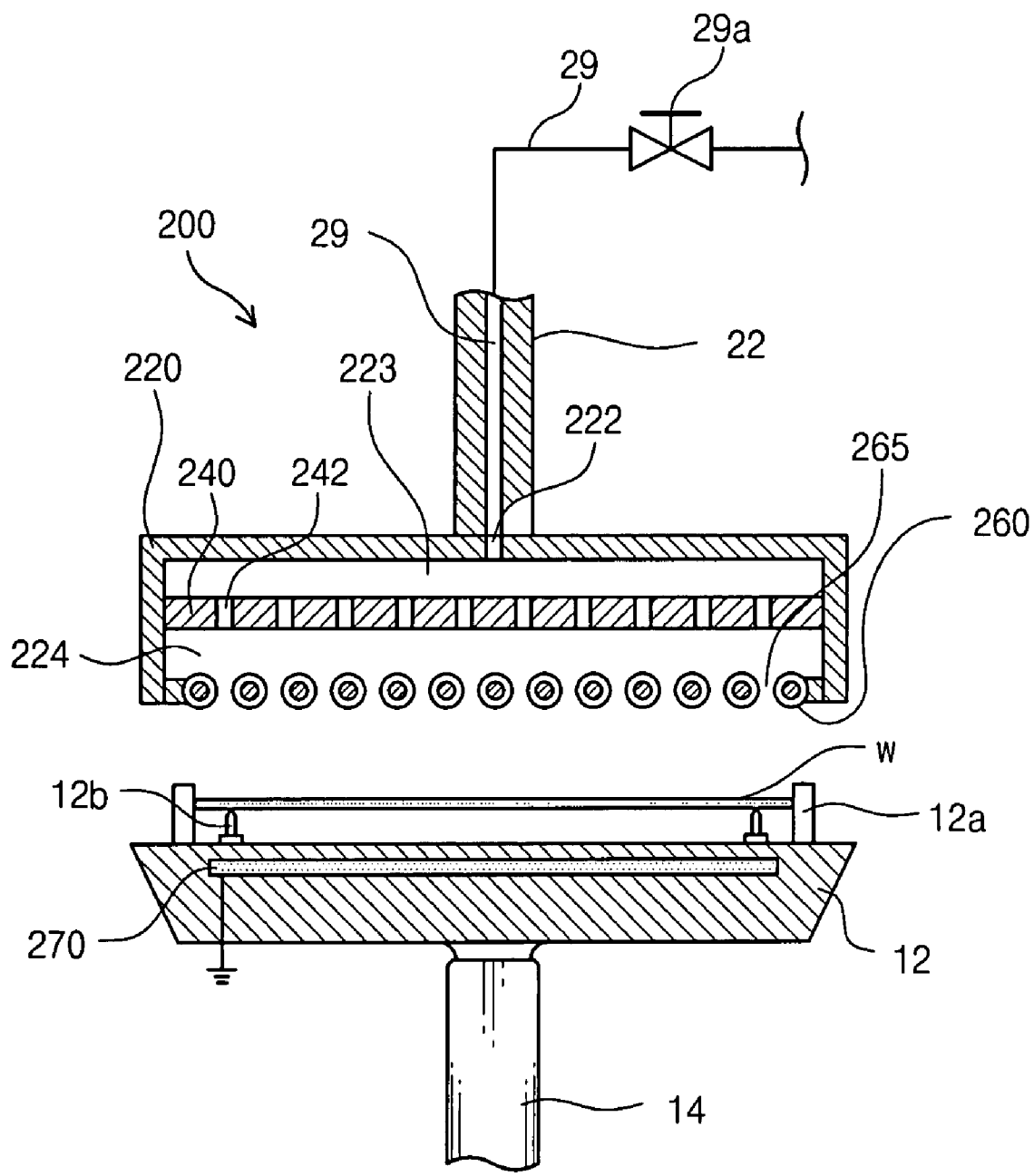
FIG. 2 illustrates a plasma supply unit according to the first embodiment of the present invention.

FIG. 2 illustrates a plasma supply unit 200 according to a first embodiment of the present invention. The plasma supply unit 200 includes a housing 220, a first electrode 260 accommodated inside the hosing 220, and a second electrode 270 installed on a plate 12.

The housing 220 includes an upper wall provided to face the plate 120 and a sidewall extending downwardly to be roughly perpendicular from the upper wall. The housing 220 has a width that is nearly equivalent to the diameter of a wafer W and a length that is nearly equivalent to the length of the first electrode 260. Thus, the housing 220 exhibits the shape of rectangular parallelepiped having the bottom where an opening is formed. A space is defined inside the housing 220. A plurality of first electrode 260 are accommodated on the opening inside the housing 220. A diffusion plate 240 is installed at the space defined over the first electrodes 260, diffusing a source gas to the first electrodes 260. The space inside the housing 220 is demarcated into a top buffer 223 and a bottom buffer 224 by means of the diffusion plate 240.

The first electrodes 260 are installed on the opening of the housing 260 to have the same height. As described above, the first electrodes 260 are disposed to generate plasma over a loaded wafer W together with the second electrode 270. The plasma is generated from a source gas supplied through a source gas line 29 and used to treat a wafer W.

As illustrated in FIG. 2, the first electrodes 260 and the wafer W are disposed abreast and spaced apart from each other. A path 265 is formed between the first electrodes 260. The source gas diffused to the top buffer 223 through the diffusion 240 is injected onto the loaded wafer W through the path 265.

Figure 3:
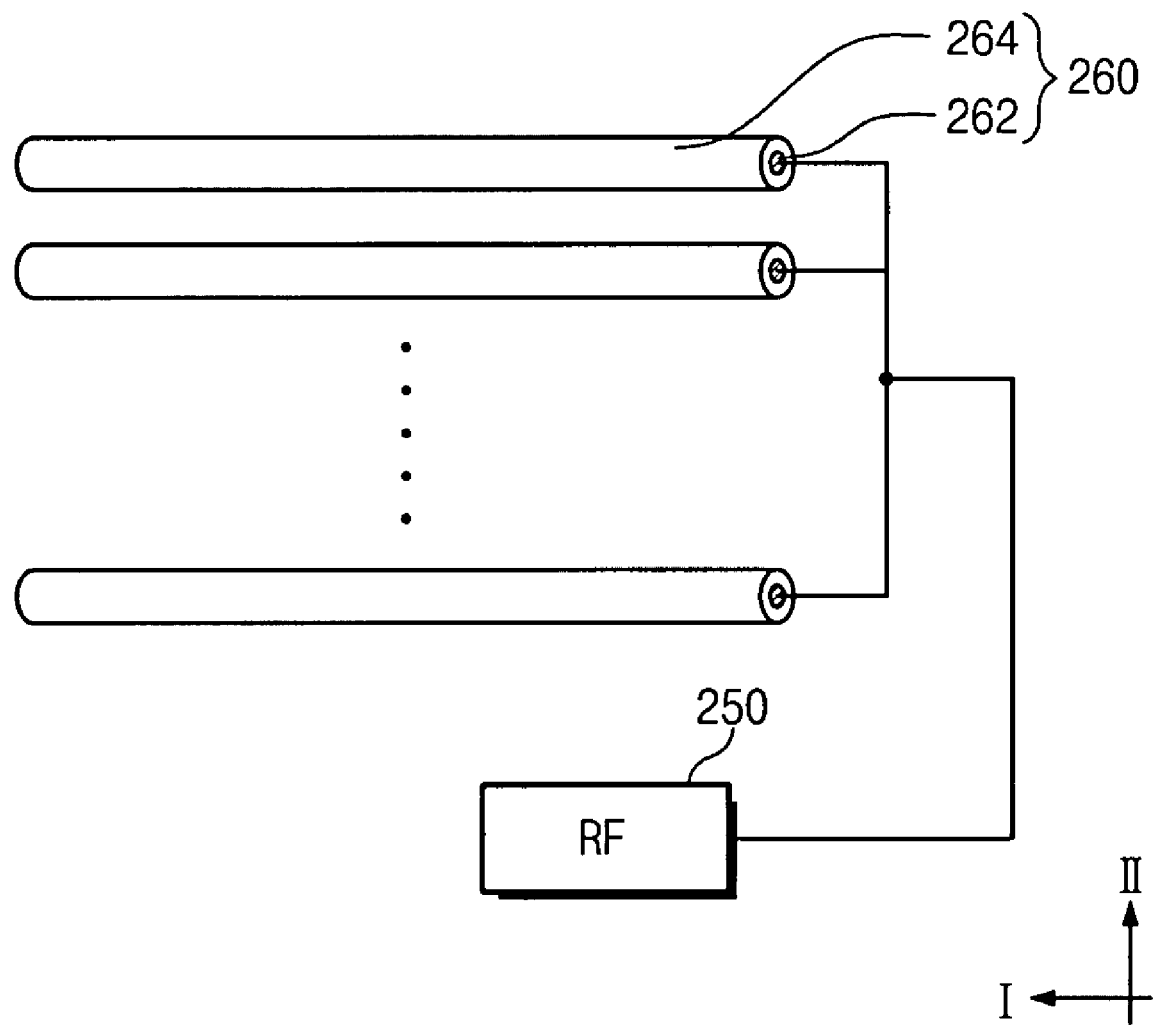
FIG. 3 illustrates that first electrodes according to the first embodiment of the present invention are each connected to a radio frequency power.

FIG. 3 illustrates that first electrodes 260 according to the first embodiment of the present invention are each connected to a radio frequency power. Each of the first electrodes 260 exhibits the shape of a long rod in a first direction I. The first electrodes 260 are juxtaposed to be spaced apart from each other in a second direction II.

The first electrode 260 includes a metal electrode 262 and a dielectric body 264 disposed to surround the metal electrode 262. After being insulated with a dielectric material, one of the two electrodes 262 and 264 is connected to an electric power to obtain plasma that is stable even under atmospheric pressure. For this reason, the dielectric body 264 surrounds the metal electrode 262. The dielectric body 264 serves to protect the metal electrode 262 from the damage caused by an electric arc formed when the plasma is generated. The dielectric body 264 is made of quartz or ceramic.

In this embodiment, the metal electrode 262 has a length that is roughly equivalent to or larger than the diameter of a wafer W. Further, the metal electrode 262 has a circular cross section but may have a polygonal cross section such as a triangular or quadrangular cross section.

The first electrodes 260 are disposed in a row, and a radio frequency power (RF) 250 of 13.56 MHz is connected in parallel to the metal electrodes 262. Accordingly, although one of the first electrodes 260 is short-circuited, a normal voltage may be applied to the others. Further, only the short-circuited first electrode 262 may be replaced. While a radio frequency power is used in this embodiment, a medium frequency power (MF) may be used.

A grounded second electrode 270 is installed on the plate 120. The second electrode 270 generates plasma over a loaded wafer W together with the first electrode 260. The second electrode 270 is buried in the plate 120 to prevent the damage caused by being exposed to the plasma.

A source gas is supplied to the tops of the first electrodes 260 through the source gas line 29. The source gas line 29 is connected to a supply hole 222 formed at an upper portion of the housing 220. The source gas inside the source gas line 29 is supplied to the top buffer 223 through the supply hole 222. The source gas supplied through the source gas line 29 may be various gases according to the kind of desired plasma.

As previously stated, the diffusion plate 240 demarcates the inside of the housing 220 into the top buffer 223 and the bottom buffer 224. The top buffer 223 defines a space where a source gas flowing in through the source gas line 29 and the supply hole 222 may be diffused.

A plurality of diffusion holes 242 are formed at the diffusion plate 240. As illustrated in FIG. 2, the diffusion holes 242 is formed to correspond to the path 265 formed between the first electrodes 260. Thus, the source gas supplied to the tops of the first electrodes 260 through the diffusion holes 242 is supplied to paths 265 formed between the first electrodes 260.

Figure 4:
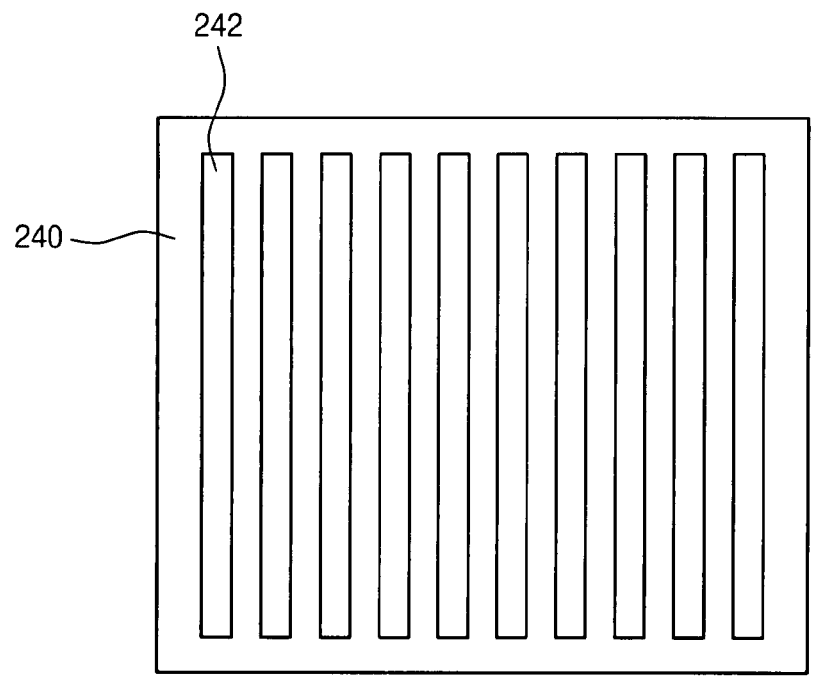
FIGS. 4 and 5 illustrate shapes of diffusion holes formed at a diffusion plate according to the present invention, respectively.
Figure 5:
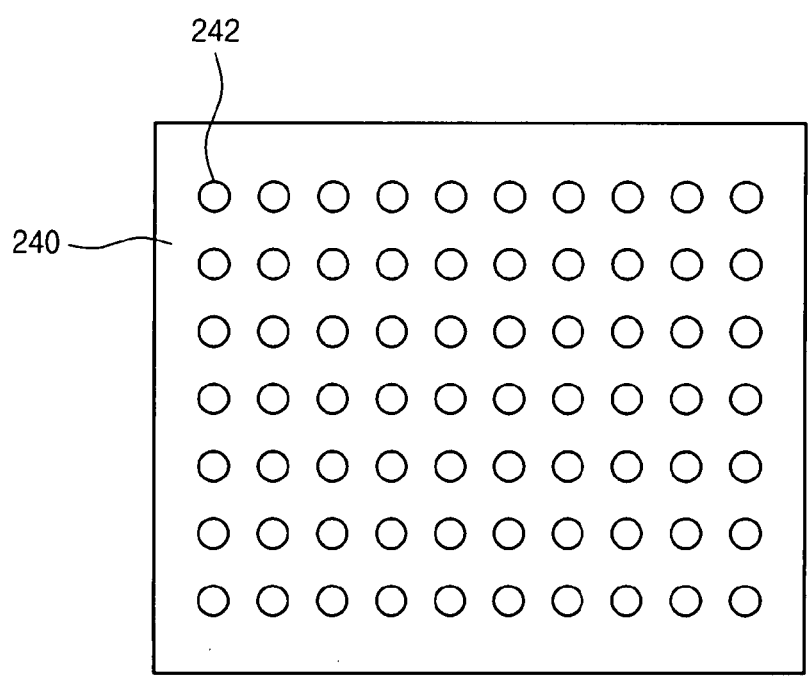

FIGS. 4 and 5 illustrate shapes of diffusion holes 242 formed at a diffusion plate 240 according to the present invention, respectively.

As illustrated in FIG. 4, diffusion holes 242 may each exhibit the shape of a slit juxtaposed with a first electrode 260. As described above, it is noted that spaces between the diffusion holes 242 must correspond to paths 265.

As illustrated in FIG. 5, diffusion holes 242 may each exhibit the shape of a hole juxtaposed with the first electrode 260. Spaces between the diffusion holes 242 are not significant but, as described above, the diffusion holes 242 must correspond to paths 265.

Figure 7:
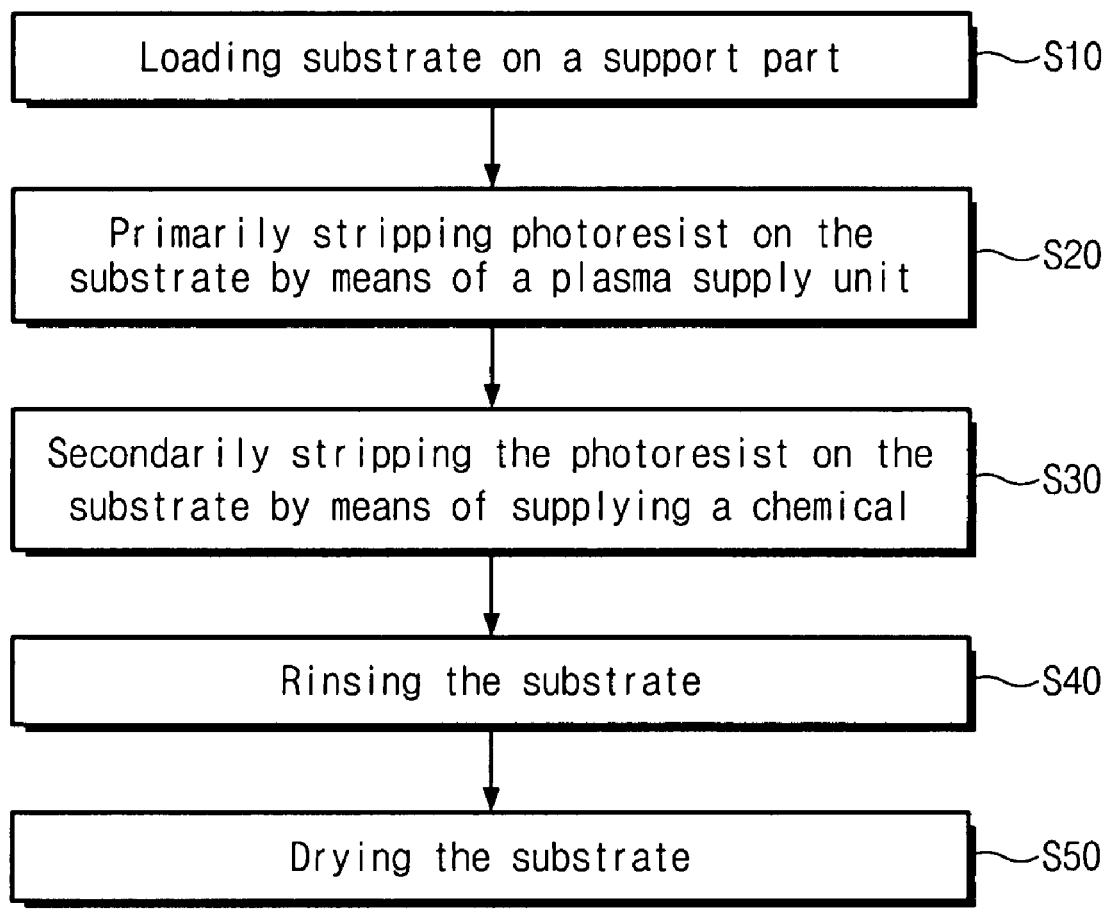
FIG. 7 is a flowchart illustrating a substrate treating method according to the first embodiment of the present invention.
Figure 8:
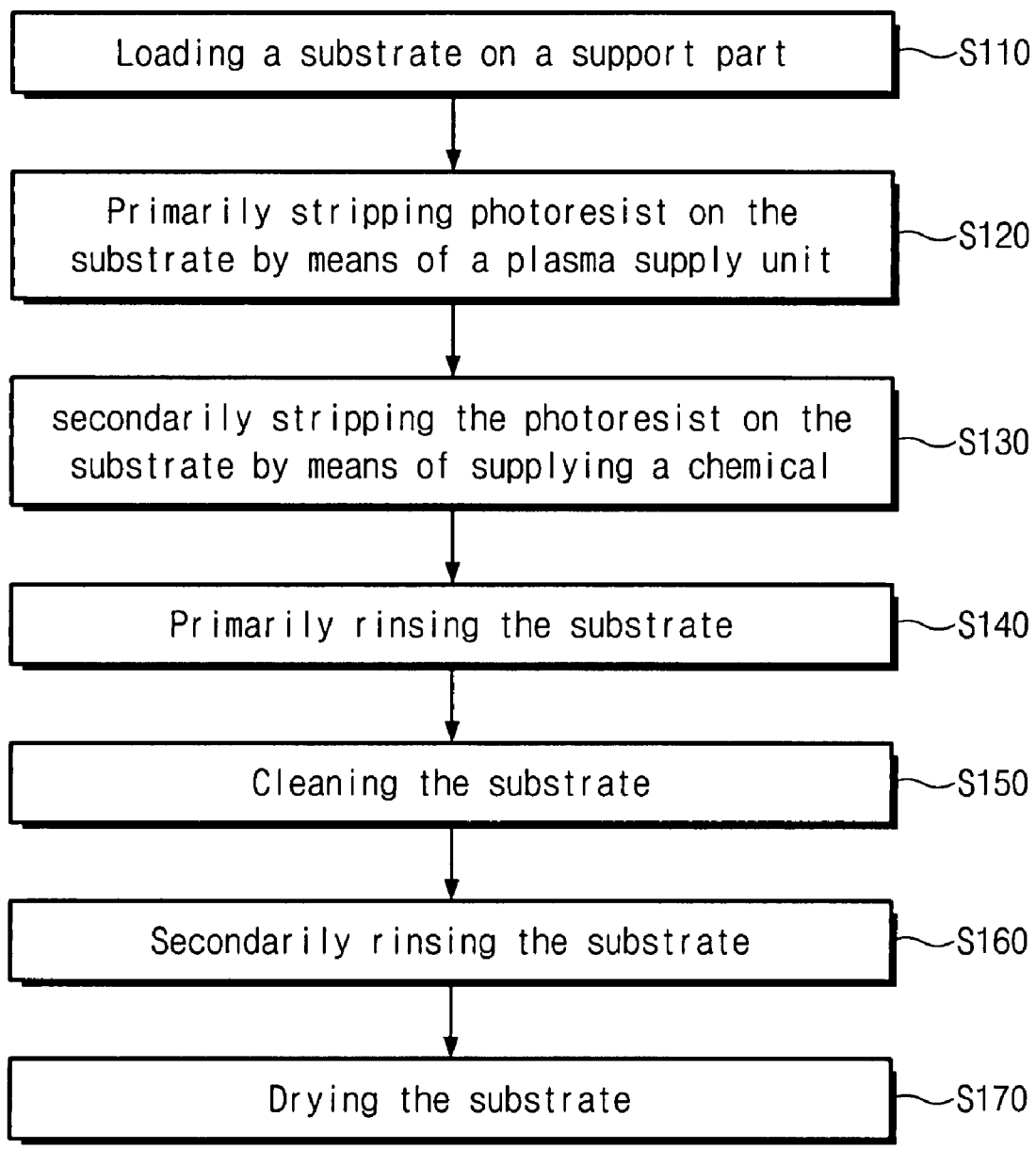
FIG. 8 is a flowchart illustrating a substrate treating method according to a second embodiment of the present invention.
Figure 9:
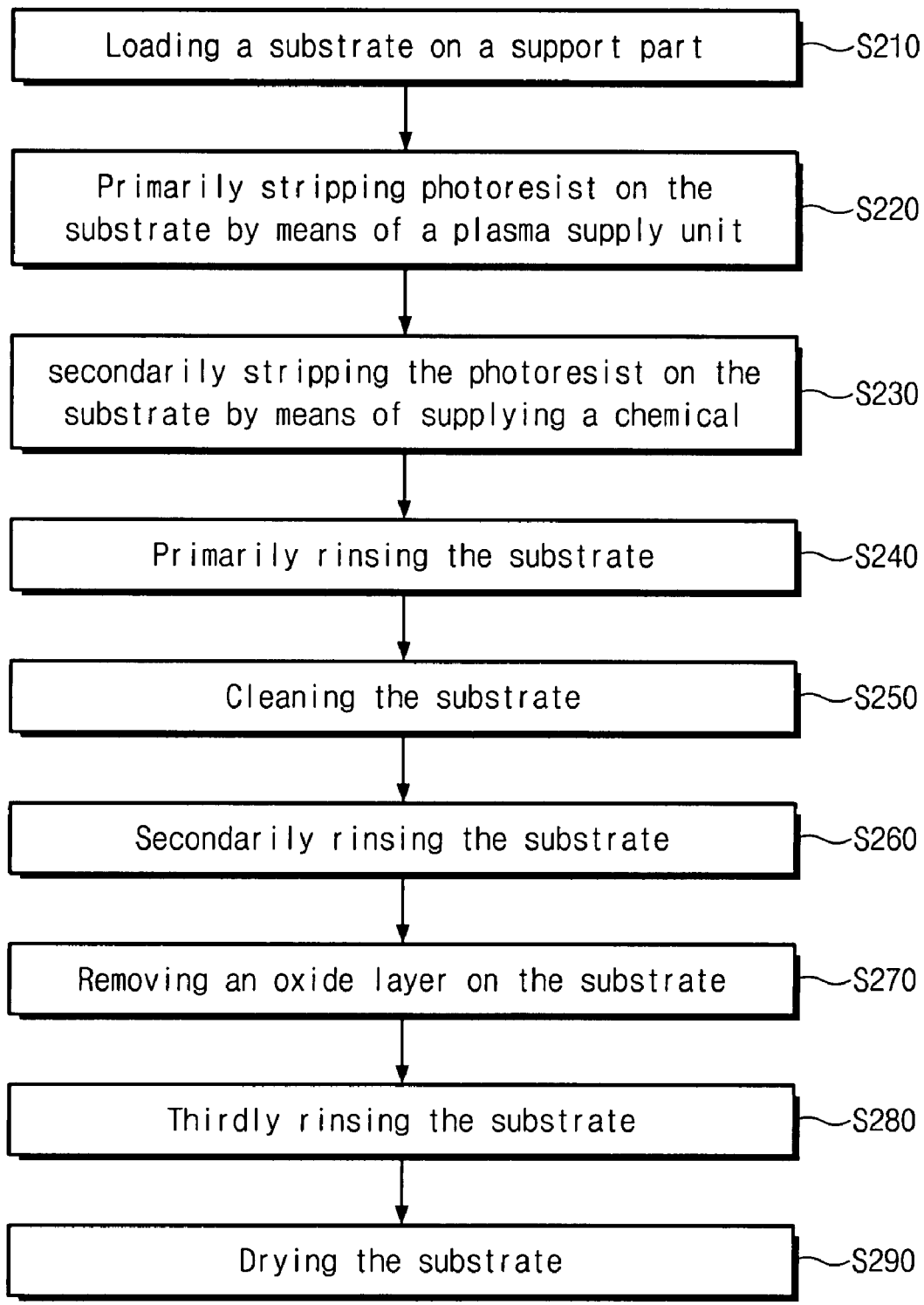
FIG. 9 is a flowchart illustrating a substrate treating method according to a third embodiment of the present invention.

FIGS. 6A through 6D illustrate the operation state of a substrate treating apparatus 1 according to the first embodiment of the present invention. FIGS. 7 through 9 are flowcharts of a substrate treating method according to the present invention. A method of operating the substrate treating apparatus 1 will now be described below with reference to FIGS. 6A through 9.

FIG. 7 is a flowchart illustrating a substrate treating method according to the first embodiment of the present invention.

Figure 6A:
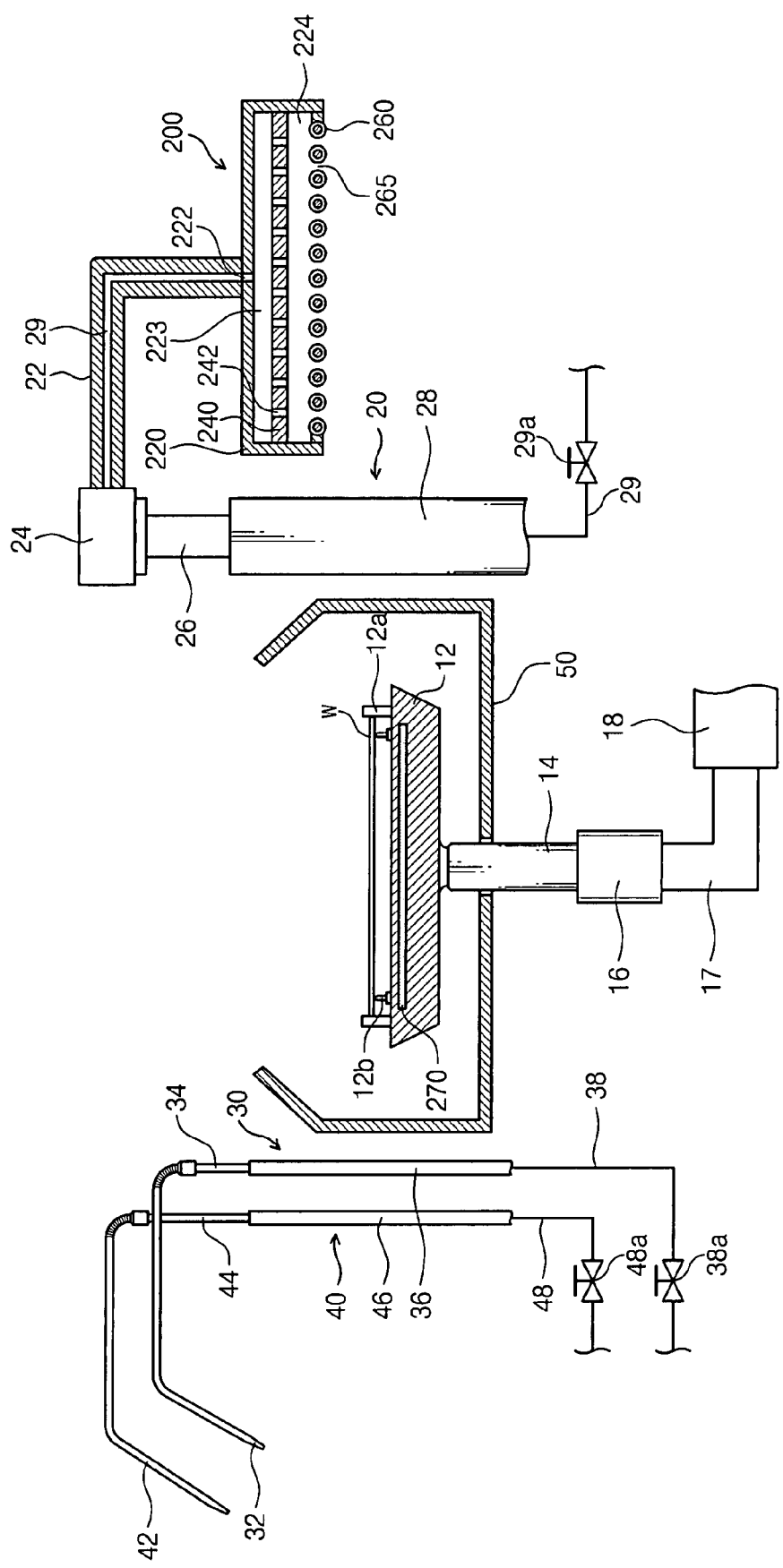
FIGS. 6A through 6D are operation states of the substrate treating apparatus according to the first embodiment of the present invention.

As illustrated in FIG. 6A, a wafer W is loaded on a plate 12 (S10). The loaded wafer W is supported by a support pin 122 and a chucking pin 124. The rotation of a support shaft 14 allows the supported wafer W to rotate with the plate 12.

Figure 6B:
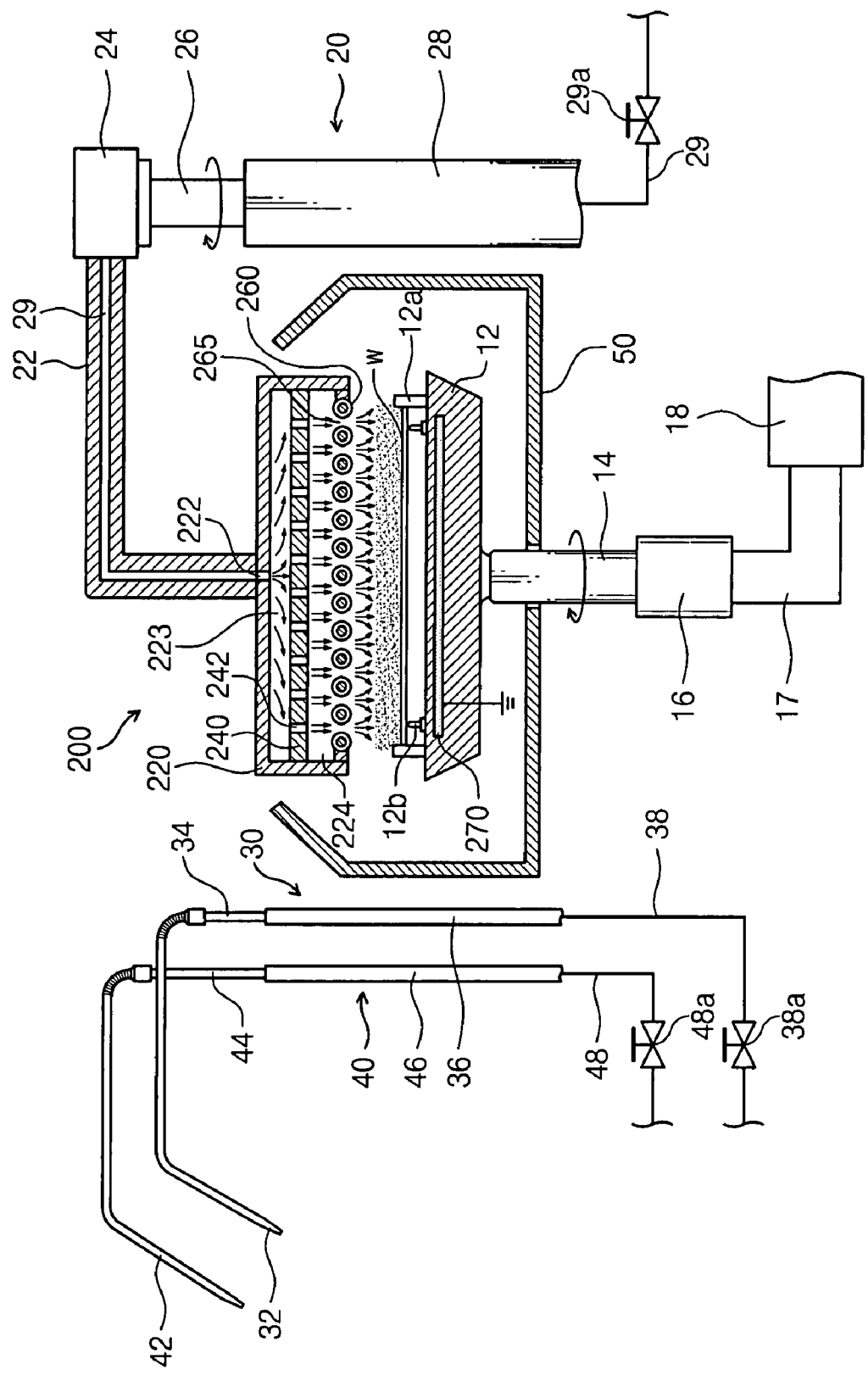

As illustrated in FIG. 6B, photoresist on the wafer W is primarily stripped by means of a dry-type treating part 20. That is, plasma is generated by means of a plasma supply unit 200 and supplied onto the wafer W to primarily strip the photoresist on the wafer W. At this point, the plasma supply unit 200 moves over the wafer W by means of a second moving part 28. The second moving part 28 rotates a second moving arm 26 to ascend the plasma supply unit 200 and then descends the second moving arm 26 to control a distance between the wafer W and the plasma supply unit 200.

The formation of a photoresist will now be described in brief. As described above, a photoresist is stripped from a substrate by means of an ashing process. However, since a photoresist provided to prevent implantation of ions into unwanted portions on the substrate is hardened during an ion implanting process, it is difficult to strip the photoresist. Accordingly, two steps are conducted to strip the photoresist. That is, the photoresist is primarily stripped by means of a dry-type treating part 20 and then secondarily stripped by means of a wet-type treating part 30.

Since a process performed by means of the dry-type treating part 20 uses a physical force, it has a lower selectivity than a process performed by means of the wet-type treating part 30. Accordingly, an underlying layer of the photoresist may be damage due to plasma. The dry-type treating part 20 partly strips the photoresist, and the underlying layer is protected from the plasma due to the remaining photoresist. The remaining photoresist is stripped by means of the wet-type treating part 30 having a higher selectivity than the dry-type treating part 20.

The primary strip of the photoresist will now be described below.

A wafer W is preheated to a predetermined temperature by means of a heater (not shown). An electric field is established over the wafer W. If a first electrode 260 is connected to a radio frequency power 250 while a second electrode 270 is grounded, a strong electric field is established between the first and second electrodes 260 and 270, i.e., over the wafer W. A source gas is supplied onto the wafer W. When a source gas valve 29a is opened, the source gas is supplied to a top buffer 223 through a supply line 29 and a supply hole 222. Diffusion holes 242 are each provided along which the source gas inside the top buffer 223 is supplied to corresponding paths 265, respectively. The source gas is supplied onto the rotating wafer W through the path 265.

The strong electric field established over the wafer W generates plasma using the source gas supplied thereover. The generated plasma migrates to the top surface of the wafer W along the flow of the source gas, being used to treat the top surface of the wafer W.

The plasma used to strip the photoresist is oxygen plasma. That is, the source gas supplied along the source gas line 29 is oxygen plasma, which is used to the photoresist on a wafer W according to the given equation. As can be understood through the equation, the oxygen plasma converts the photoresist to gaseous byproducts ($CO_2$ and $H_2O$).

$$C_xH_y + O^* \rightarrow CO_2(\uparrow) + H_2O(\uparrow)$$

While "photoresist is stripped using oxygen plasma" is described in this embodiment, various kinds of plasma may be used. On the other hand, atmospheric plasma is used in this embodiment. The atmospheric plasma is different from vacuum plasma generated while an inner pressure of a process chamber is equal to or lower than the atmospheric pressure. A step of forcibly exhausting a gas inside the process chamber to the outside by means of a separate vacuum device is additionally required to generate the vacuum plasma.

Figure 6C:
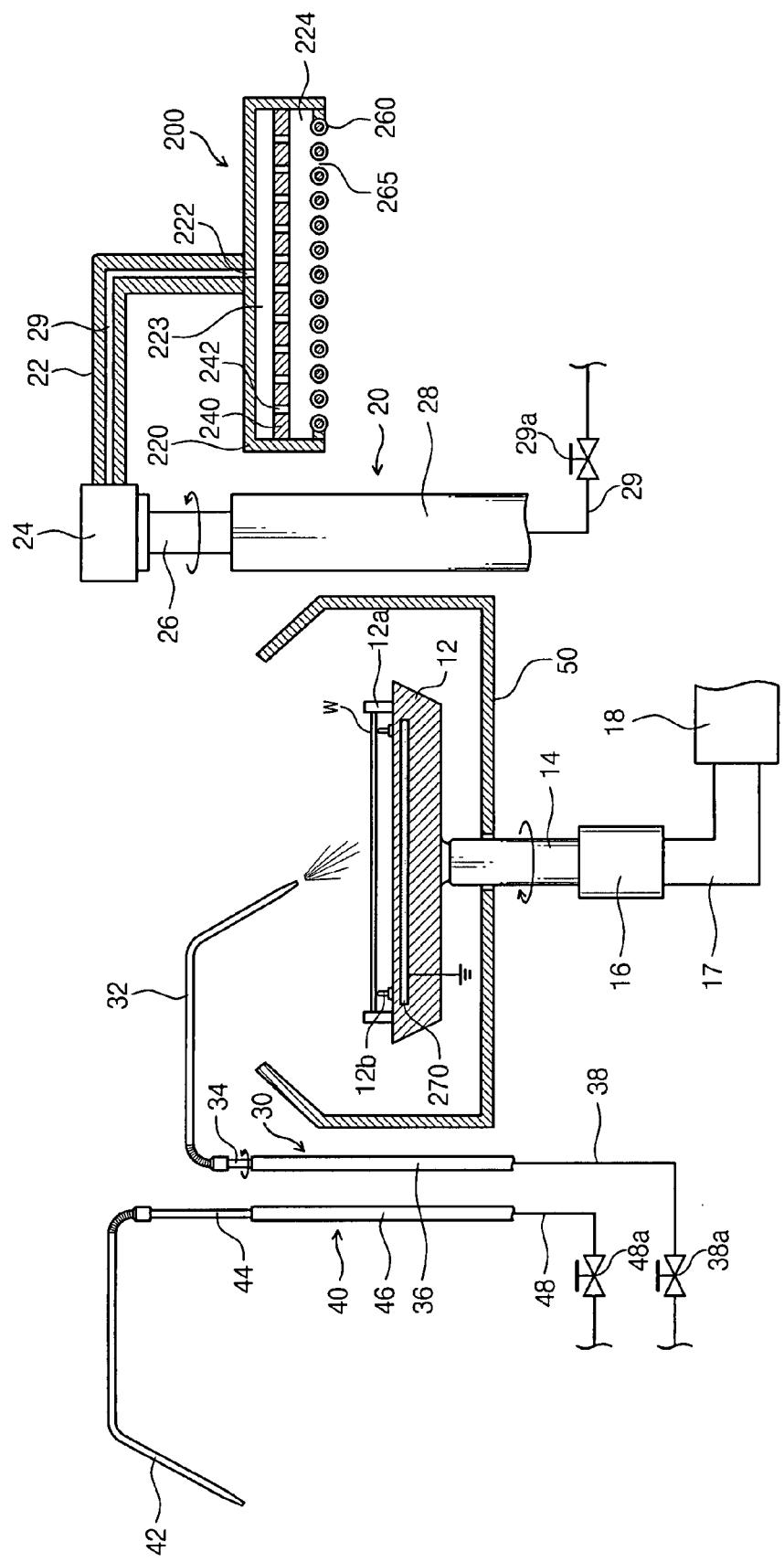
Figure 6D:
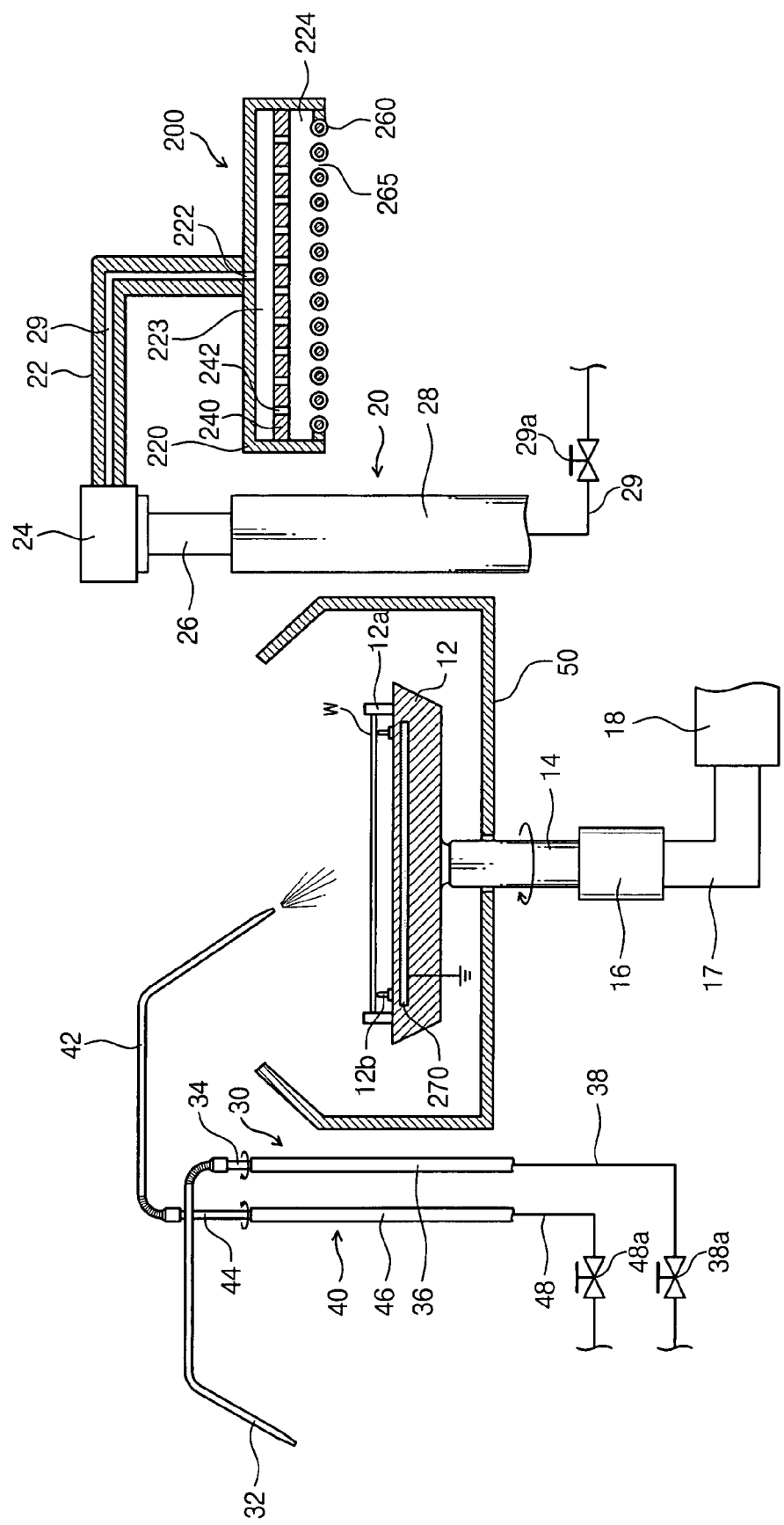

As illustrated in FIG. 6C, the photoresist on the wafer W is secondarily stripped by means of a wet-type treating part 30 (S30). The photoresist hardened during an ion implanting process is not easily stripped by means of the dry-type treating part 20, as described above. Therefore, the procedure described below is required to fully strip the hardened photoresist.

The plasma supply unit 200 primarily stripping the photoresist on the wafer W moves to deviate from the top of the wafer W to the outer side of a support part 10. The principle of moving the plasma supply unit 200 from the top of the wafer W is identical to that of moving the plasma supply unit 200 to the top of the wafer W. If the plasma supply unit 200 deviates from the top of the wafer W, a chemical nozzle 32 moves to the top of the wafer W. Similar to the plasma supply unit 200, the chemical nozzle 32 moves to the top of the wafer W by elevation and rotation of a chemical nozzle moving arm 34.

The wet-type treating part 30 is configured to supply a chemical onto the wafer W. When a valve 38a is opened, the chemical is supplied to a chemical nozzle 32 along a chemical line 38. The supplied chemical is injected onto the rotating wafer W through the chemical nozzle 32. The injection time of the supplied chemical is long enough to fully strip the photoresist on the wafer W.

The wet-type treating part 30 uses sulfuric acid ($H_2SO_4$), which is supplied onto the wafer W through the chemical line 38 and the chemical nozzle 32. The sulfuric acid decomposes the photoresist into $CO_2$ and $H_2O$. While sulfuric acid is used as a chemical in this embodiment, another acid or strong oxidant may be used.

The wafer W is rinsed by means of the wet-type treating part 30 (S40). The wet-type treating part 30 supplies a rinse solution onto the wafer W. When the valve 38a is opened, the rinse solution is supplied to the chemical nozzle 32 along the chemical line 38. The supplied rinse solution is injected onto the wafer W through the chemical nozzle 32. The rinse solution is deionized water (deionized $H_2O$), but another rinse solution may be used.

While "the chemical and the rinse solution are supplied along the chemical line 38" is described in this embodiment, a rinse solution may be supplied along a separate rinse solution line (not shown).

The wafer W is dried by means of a drying part 40. The chemical nozzle 32 supplying the rinse solution onto the wafer W moves to deviate from the top of the wafer W to the outer side of a support part 10. If the chemical nozzle 32 deviates from the top of the wafer W, a dry nozzle 42 moves to the top of the wafer W. Similar to the plasma supply unit 200, the dry nozzle 42 moves to the top of the wafer W by elevation and rotation of a dry nozzle moving arm 44. The elevation and rotation of the dry nozzle moving arm 44 are done by means of a dry nozzle moving part 46.

The drying part 30 is configured to supply a dry gas onto the wafer W. When a valve 48a is opened, the dry gas is supplied to the dry nozzle 42 along a dry gas line 48. The supplied dry gas is injected onto the rotating wafer W through the dry nozzle 42. The dry gas is nitrogen gas, but may be another dry gas.

As described above, the photoresist hardened during an ion implanting process may be primarily stripped using plasma and secondarily stripped using a chemical. Since the plasma is used to strip the photoresist, a separate vacuum device is not required. While a wafer W is loaded on a plate 12, photoresist on the wafer W may be successively removed by means of a plasma supply unit 200 and a chemical nozzle 42.

In addition, a dielectric body 264 surrounds a metal electrode 262 to protect the metal electrode 262 from the damage caused by an electric arc formed when plasma is generated. Moreover, since metal electrodes 262 are connected in parallel to a radio frequency power 250, a high frequency power may be applied to undamaged metal electrodes 262 even though several metal electrodes 262 are damaged. Thus, a process may be continuously performed and the damaged metal electrodes 262 may be replaced.

Furthermore, since a source gas is directly supplied onto the wafer W through a path 26 formed between first electrodes 260, a source gas ambient may be established between a first electrode 260 and a second electrode 270 by using a small amount of source gas.

FIG. 8 illustrates a flowchart illustrating a substrate treating method according to the second embodiment of the present invention. Steps S110-S140 of FIG. 8 are identical to those described with reference to FIG. 7.

The wafer W is cleaned by means of a wet-type treating part 30 (S150). The wet-type treating part 30 supplies a cleaning solution onto the wafer W. When a valve 38a is opened, the cleaning solution is supplied to a chemical nozzle 32 along a chemical line 38. The supplied cleaning solution is injected onto the rotating wafer W through the chemical nozzle 32.

The cleaning solution is the standard clean-1 (SC-1), which is the mixture of ammonium hydroxide ($NH_4OH$), hydrogen peroxide ($H_2O_2$), and water ($H_2O$) with a mixture of approximately 1:1:5~0.05:1:5 at a temperature ranging from 80 to 90 degrees centigrade. The SC-1 is used to remove particles and organic contaminants. However, another cleaning solution may be used.

While "a cleaning solution is supplied along a chemical line 38" is described in this embodiment, a cleaning solution may be supplied along a separate cleaning solution line (not shown).

The wafer W is secondarily rinsed by means of the wet-type treating part 30 (S160). The primary rinsing and the secondary rinsing are conducted by means of the same manner. The secondarily rinsed wafer W is dried by means of a drying part 40 (S170). The drying is the same as described above.

According to the foregoing, not only photoresist but particles and contaminants may be removed from the wafer W.

FIG. 9 is a flowchart illustrating a substrate treating method according to the third embodiment of the present invention. Steps S210-S260 of FIG. 9 are identical to the steps S110-S160 described with reference to FIG. 8.

An oxide layer on a wafer W is etched by means of a wet treatment part 30 (S270). The wet-type treating part 30 supplies an etching solution onto a wafer W. When a valve 38a is opened, the etching solution is supplied to a chemical nozzle 32 along a chemical line 38. The supplied etching solution is injected onto the rotating wafer W through the chemical nozzle 32.

The etching solution is hydrofluoric acid diluted using deionized water (deionized $H_2O$). The diluted hydrofluoric acid (DHF) is used to effectively remove chemical oxide or native oxide generated during various cleaning processes. Moreover, the DHF may be used to effectively remove metal contaminants contained in oxide. However, another etching solution may be used.

While "an etching solution is supplied along a chemical line 38" is described in this embodiment, a cleaning solution may be supplied along a separate etching solution line (not shown).

The wafer W is tertiarily rinsed by means of the wet-type treating part 30 (S280). The tertiary rinsing is conducted by means of the same manner as the primary rinsing and the secondary rinsing. The tertiarily rinsed wafer W is dried by means of a drying part 40. The drying is the same as described above.

According to the foregoing, not only photoresist but oxide may be removed from the wafer W.

Figure 10:
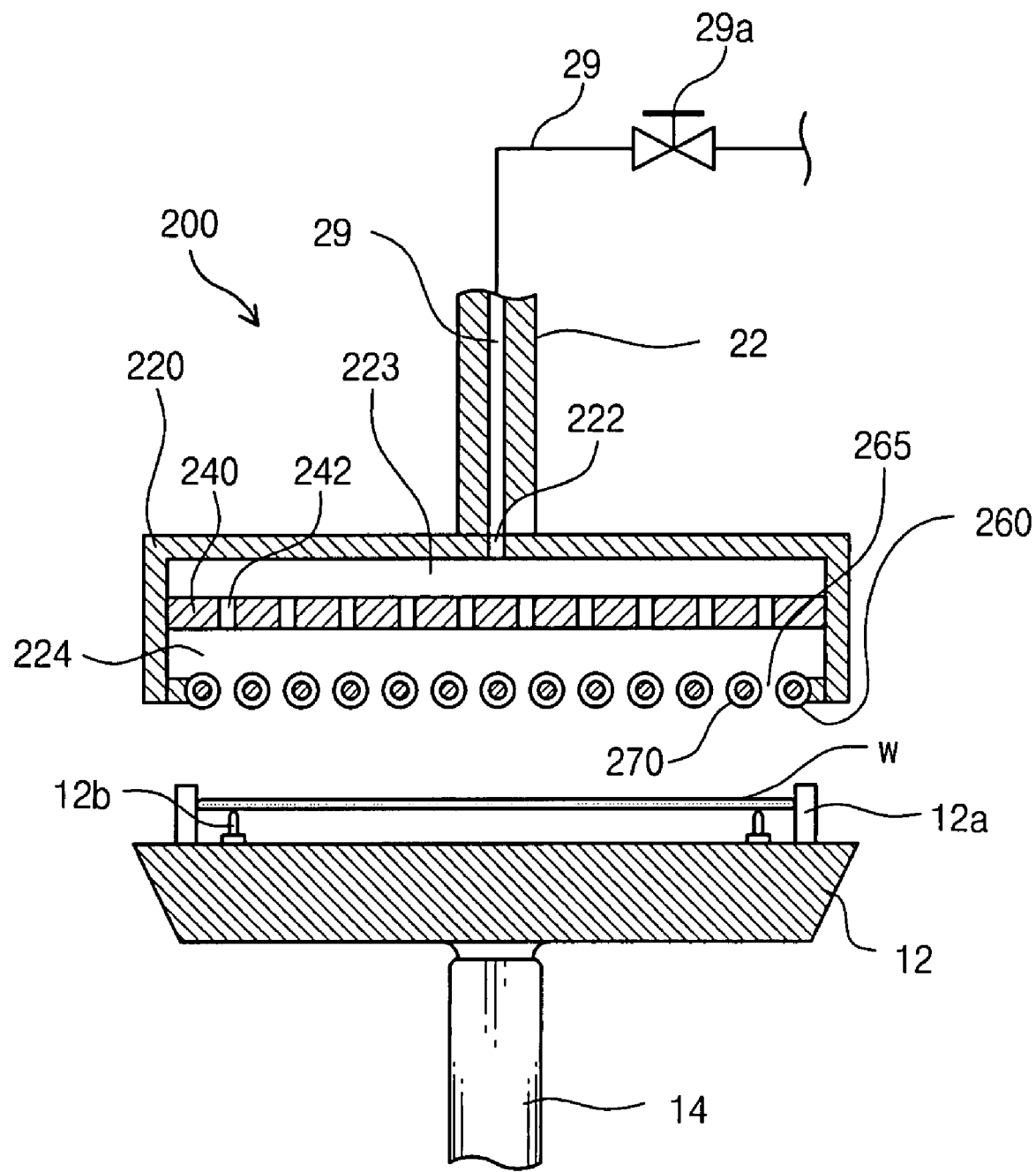
FIG. 10 illustrates a plasma supply unit according to the second embodiment of the present invention.
Figure 11:
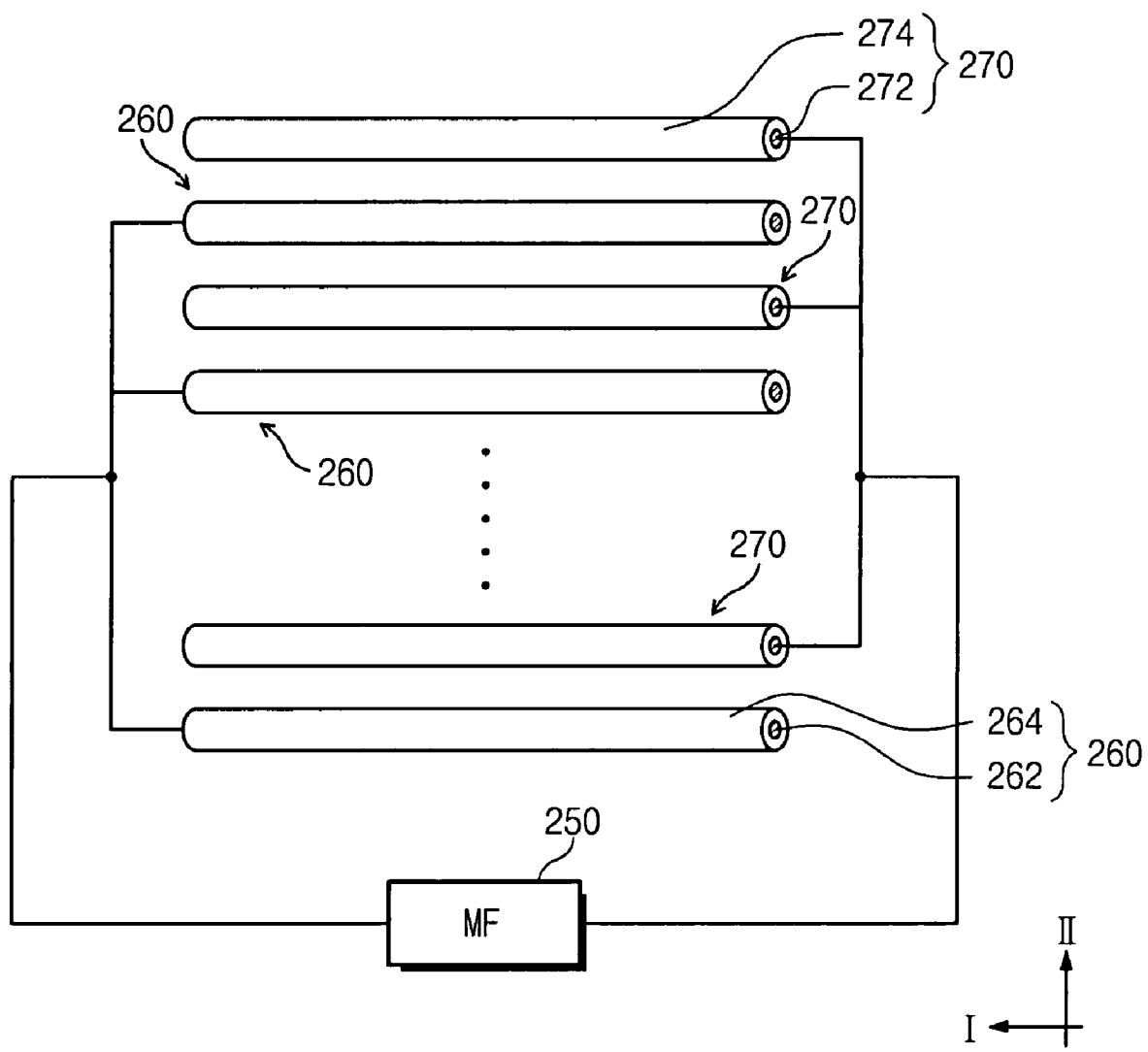
FIG. 11 illustrates that first and second electrodes according to the second embodiment of the present invention are each connected to an electric power.
Figure 12:
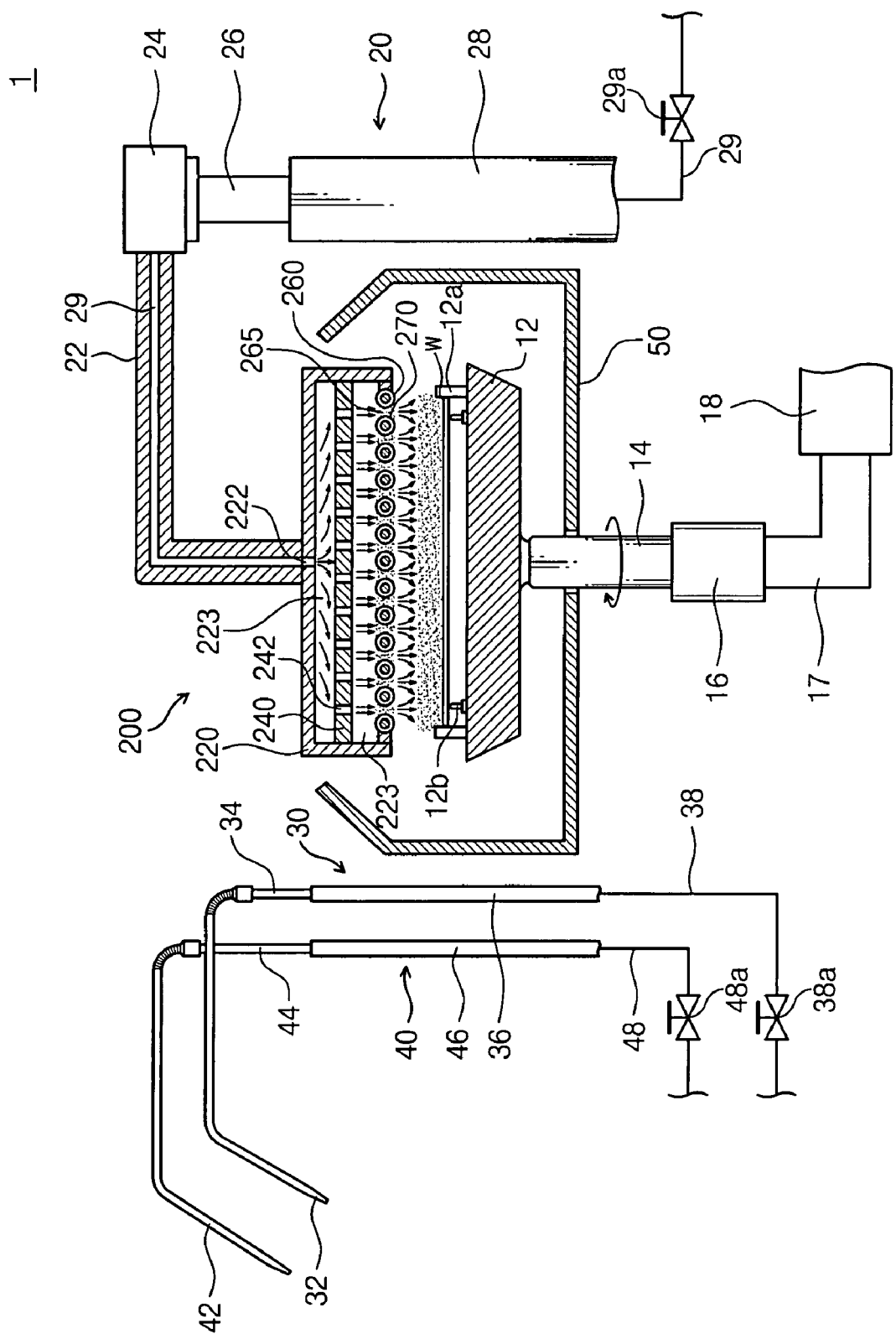
FIG. 12 illustrates an operation state of a substrate treating apparatus according to the second embodiment of the present invention.

FIG. 10 illustrates a plasma supply unit 200 according the second embodiment of the present invention, and FIG. 11 illustrates that first and second electrodes 260 and 270 according to the second embodiment of the present invention are each connected to an electric power. FIG. 12 illustrates an operation state of a substrate treating apparatus 1 according to the second embodiment of the present invention.

The first and second electrodes 260 and 270 are installed on an opening of a housing 220 to be disposed at the same height. The first and second electrodes 260 and 270 generate plasma over a wafer W.

As illustrated in FIG. 10, the first and second electrodes 260 and 270 are disposed to roughly juxtapose with a wafer W and to be spaced apart from each other. A path 265 is formed between the first and second electrodes 260 and 270. A source gas diffused to a bottom buffer 224 from a top buffer 223 through a diffusion plate 240 is injected onto the loaded wafer W along the path 250.

As illustrated in FIG. 11, each of first and second electrodes 260 and 270 exhibits the shape of a long rod in a first direction I. The first and second electrodes 260 and 270 are disposed to be spaced apart from each other in a second direction II which is perpendicular to the first direction I. The first electrode 260 includes a rod-shaped metal electrode 262 and a dielectric body 264 disposed to surround the metal electrode 262. The dielectric body 264 serves to protect the metal electrode 262 from damage caused by an electric arc formed when plasma is generated. Similarly, the second electrode 270 includes a rod-shaped metal electrode 272 and a dielectric body 274. Each of the dielectric bodies 264 and 274 is made of quartz or ceramic.

In this embodiment, each of the metal electrodes 262 and 272 has a length that is nearly equivalent to or larger than the diameter of a wafer W. Further, each of the metal electrodes 262 and 272 has a circular cross section but may have a polygonal cross section such as a triangular or quadrangular cross section.

The first and second electrodes 260 and 270 are alternately arranged. A first voltage is applied between the first electrodes 260, and a second voltage is applied between the second electrodes 270. The second voltage is lower than the first voltage and applied to establish an electric field between the first and second electrodes 260 and 270. Although will be described later, a source gas is supplied between first and second electrodes 260 and thus an electric field is established to generate plasma.

The first and second voltages are applied in parallel to the first and second electrodes 260 and 270. Thus, although one of the first electrodes 260 is short-circuited, a normal voltage may be applied to the others. Similarly, although one of the second electrodes 260 is short-circuited, a normal voltage may be applied to the others. The short-circuited first or second electrode 270 may be replaced partly. A medium frequency power (MF) is used in this embodiment, but a radio frequency power may be used.

A method for generating plasma using the plasma supply unit 200 illustrated in FIG. 10 will now be described below.

An electric field is established between first and second electrodes 260 and 270. A first voltage is applied first electrodes 260. A second voltage, which is lower than the first voltage, is applied to second electrodes 270. At this point, a potential difference arises between the first and second electrodes 260 and 270 to establish an electric field.

A source gas is supplied to a path 265 formed between the first and second electrodes 260 and 270. When a source gas valve 29a is opened, the source gas is supplied to a top buffer 223 through a supply line 29 and a supply hole 222. Diffusion holes 242 are provided through which the source gas in the top buffer 223 is supplied to corresponding paths 265, respectively. Due to the electric field established between the first and second electrodes 260 and 270, plasma is generated using the source gas supplied to the path 265 formed therebetween. The generated plasma migrates to the top surface of a wafer W along the flow of continuously supplied source gas, being used to treat the top surface of the wafer W.

Figure 13A:
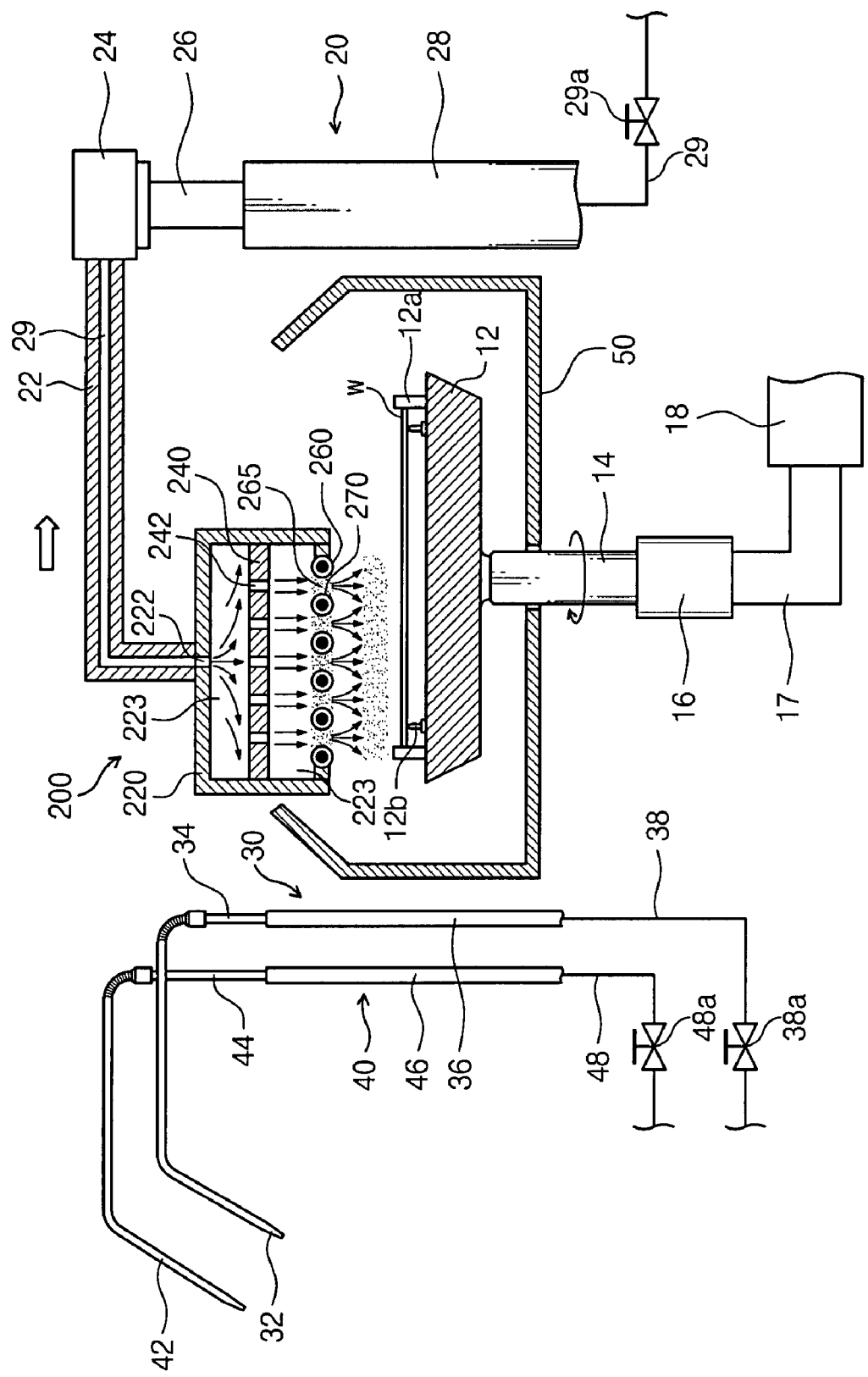
FIGS. 13A and 13B illustrate an operation state of a plasma supply unit according to the third embodiment of the present invention.
Figure 13B:
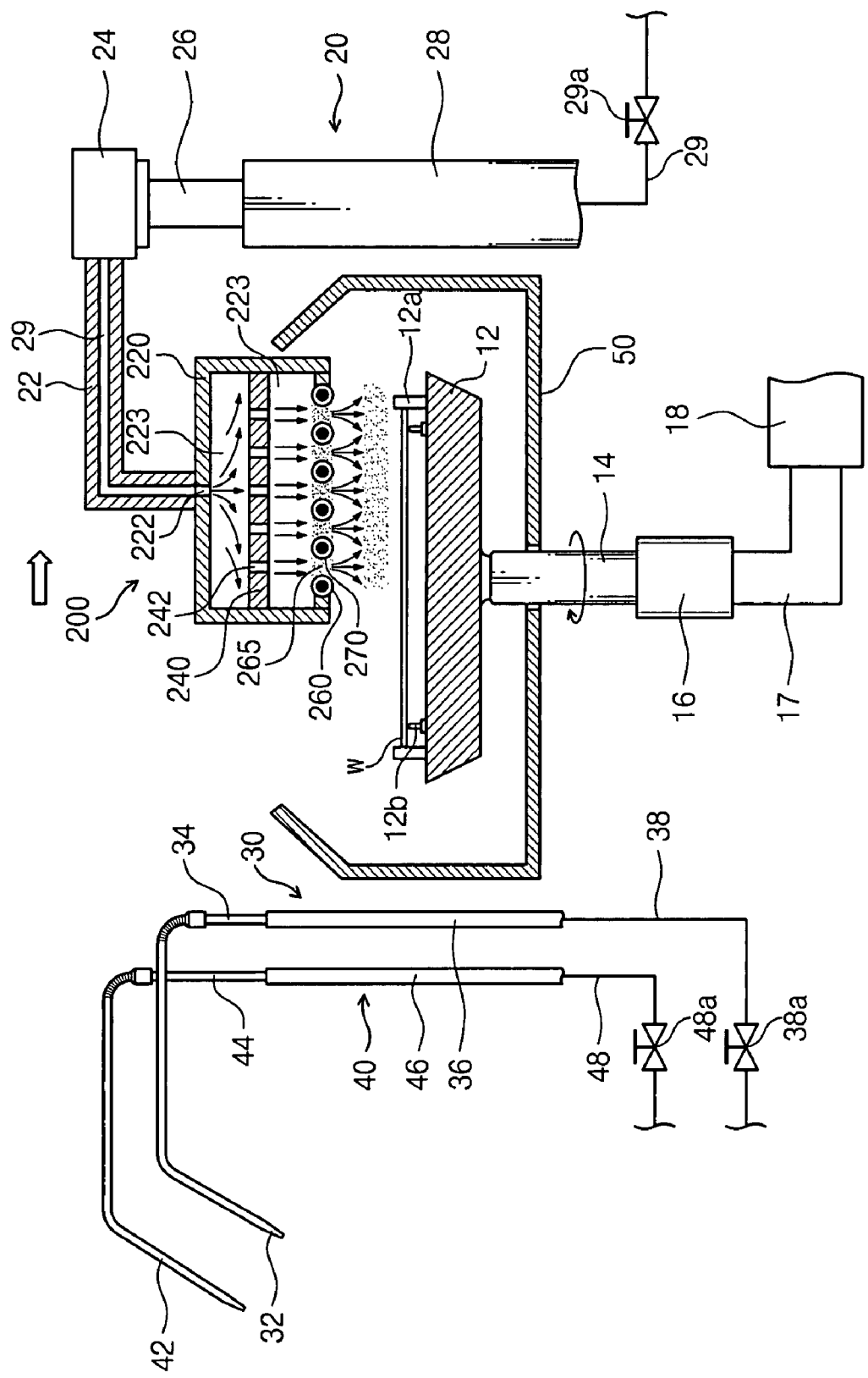

FIGS. 13A and 13B illustrate an operation state of a plasma supply unit 200 according to the third embodiment of the present invention. Elements, which will not be described below, have the same configuration as those of the plasma supply unit 200 illustrated in FIGS. 10 and 11.

As illustrated in FIG. 13A, a housing 220 has a width that is nearly equivalent to the radius of a wafer W. Therefore, the plasma supply unit 200 must move from one side to the other side of the wafer to treat the entire surface of the wafer W by means of the plasma supply unit 200.

The width of the housing 220 is associated with wafer processing time. If the width of the housing 220 increases, time required for moving the wafer W from one side to the other side of the wafer W decreases. One the other hand, if the width of the housing 220 decreases, time required for moving the wafer W from one side to the other side of the wafer W increases. However, width increase of the housing 220 results in size increase of the plasma supply unit 200. Accordingly, the width of the housing 220 is decided considering the moving time and size of the plasma supply unit 200. The housing 220 may have a width that is larger or smaller than the radius of the wafer W.

As illustrated in FIGS. 13A and 13B, a first moving part 24 linearly moves a first moving arm in the above-mentioned second direction II. The plasma supply unit 200 must move to supply the plasma generated inside the plasma supply unit 200 from one side to the other side of the wafer W, and the first moving arm 24 must have a corresponding stroke.

Each of metal electrodes 262 and 272 has a length that is nearly equivalent to or larger than the diameter of the wafer W. Therefore, as will be described later, first and second electrodes 260 and 270 move linearly or the wafer W rotates to treat the entire surface of the wafer W.

A method for supplying plasma by means of the plasma supply unit 200 illustrated in FIGS. 13A and 13B will now be described below.

As illustrated in FIG. 13A, the plasma supply unit 200 is located on the edge of a wafer. In order to supply the plasma to the edge of the wafer W, the edge of the wafer W must be disposed within a plasma injection range of the plasma supply unit 200. When the plasma is supplied from the plasma supply unit 200, a first moving part 24 moves a first moving arm 22 right. At this point, a housing 220 connected to the bottom end of the first moving arm 22 moves right with the first moving arm 22 and the plasma is supplied onto the rotating wafer W at an injection path 265 formed at a lower portion of the housing 220.

According to the foregoing, while a housing 220 moves right from one side to the other side of a wafer W, plasma is supplied to the entire surface of the wafer W to treat the surface of the wafer W. Further, since the wafer W rotates with a plate 12, the entire surface of the wafer W may be treated uniformly.

Figure 14:
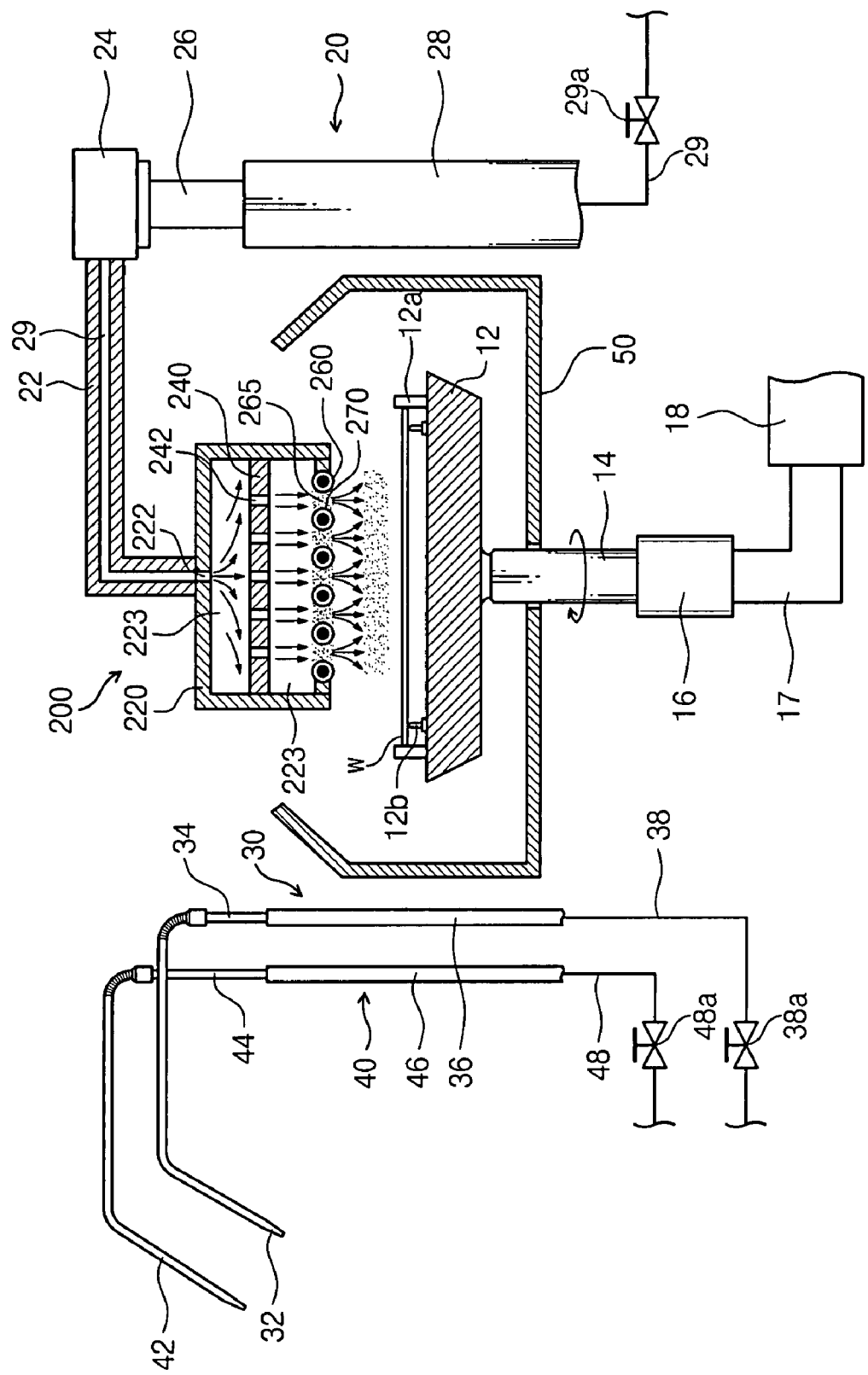
FIG. 14 illustrates an operation state of a plasma supply unit according to a fourth embodiment of the present invention.

FIG. 14 illustrates an operation state of a plasma supply unit 200 according to a fourth embodiment of the present invention.

In this embodiment, the center of a housing 220 is disposed to match the rotation center of a wafer W and does not move right and left or back and forth during a process. While the center of the housing 220 matches the rotation center of the wafer W, plasma is supplied onto the wafer W rotating with the plate 12 to treat the surface of the wafer W.

As described above, if plasma is supplied onto the wafer W while the hosing 220 is stopped and the wafer W rotates, the entire surface of the wafer W is treated.

According to the present invention, there are achieved advantages as follows: (1) photoresist hardened during an ion implanting process is readily stripped; (2) a photoresist strip process, a rinse process, and a dry process are successively performed for a loaded wafer; (3) an electrode is protected from the damage caused by an electric arc discharged when plasma is generated; (4) a source gas ambient is established between electrodes using a small amount of source gas; (5) a process is performed even when electrodes are partly damaged, and the damaged electrodes can be replaced; (6) a size of a housing decreases; and (7) the entire surface of a wafer is uniformly treated by means of a reduced plasma generator.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A substrate treating apparatus for stripping photoresist on a substrate, the substrate treating apparatus comprising:
   a support part for supporting the substrate such that a pattern surface of the substrate faces upwardly;
   a dry-type treating part disposed at a first side of the support part for supplying plasma onto the substrate to primarily strip the photoresist on the substrate, the dry-type treating part comprising:
      a gas supply unit for supplying a source gas above the substrate during a dry-type treatment; and
      a plasma supply unit for supplying plasma onto the substrate; the plasma support unit comprising at least one top electrode disposed above the substrate such that a length of the at least one top electrode is parallel with the pattern surface of the substrate, and wherein the length of the at least one electrode is substantially equal to or greater than a diameter of the substrate; and
   a wet-type treating part disposed at a second side of the support part for supplying a chemical onto the substrate to secondarily strip the photoresist on the substrate.

2. The substrate treating apparatus of claim 1, wherein the dry-type treating part further comprises:
   a plurality of top electrodes disposed above the substrate during the dry-type treatment and arranged to be spaced apart from each other at the same height; and
   a bottom electrode disposed below the substrate to generate plasma with the top electrodes.

3. The substrate treating apparatus of claim 2, wherein each of the top electrodes comprises:
   a metal electrode to which an electric power is applied; and
   a dielectric body disposed to surround the metal electrode.

4. The substrate treating apparatus of claim 3, wherein the metal electrode is rod-shaped.

5. The substrate treating apparatus of claim 2, wherein the gas supply unit comprises:
   a diffusion plate, disposed over the top electrode, where a plurality of diffusion holes are formed; and
   a supply line along which a source gas is supplied onto the diffusion plate.

6. The substrate treating apparatus of claim 1, wherein the dry-type treating part further comprises:
   a plurality of top first electrodes arranged in a row to be spaced apart from each other at the same height of the top of the substrate during the dry-type treatment; and
   a plurality of second electrodes arranged in a row to be spaced apart from each other at the same height as the first electrodes,
   wherein a first voltage is applied to the first electrodes and a second voltage is applied to the second electrodes, the second voltage being lower than the first voltage, and
   wherein the plurality of first and second electrodes are alternately arranged to generate plasma between the first and second electrodes.

7. The substrate treating apparatus of claim 6, wherein the plurality of top first electrodes comprises a first metal electrode to which a first voltage is applied and a first dielectric body disposed to surround the first metal electrode, and
   wherein the plurality of second electrodes comprises a second metal electrode to which a second voltage is applied and a second dielectric body disposed to surround the second metal electrodes.

8. The substrate treating apparatus of claim 7, wherein each of the plurality of first and second metal electrodes is rod-shaped.

9. The substrate treating apparatus of claim 6, wherein the gas supply unit comprises:
   a diffusion plate, disposed over the first and second electrodes, where a plurality of diffusion holes are formed; and
   a supply line along which a source gas is supplied onto the diffusion plate.

10. The substrate treating apparatus of claim 1, wherein the dry-type treating part further comprises:
    the plasma supply unit disposed over the substrate to supply plasma onto the substrate; and
    a moving unit for varying a relative position of the plasma supply unit and the substrate when the plasma is supplied to substrate from the plasma supply unit.

11. The substrate treating apparatus of claim 10, wherein the plasma supply unit further comprises:
    a plurality of first electrodes exhibiting the shape of a long rod in a first direction and arranged on the substrate in a row to be spaced apart from each other in a second direction that is perpendicular to the first direction;
    a plurality of second electrodes exhibiting the shape of a long rod in the first direction and arranged on the substrate in a row to be spaced apart from each other in the second direction; and a housing accommodating the plurality of first and second electrodes and having a length in the first direction that is equivalent to or larger than the diameter of the substrate and a length in the second direction that is smaller than the diameter of the substrate, wherein a first voltage is applied to the plurality first electrodes and a second voltage is applied to the plurality second electrodes, the second voltage being lower than the first voltage, wherein the plurality of first and second electrodes are alternately arranged to generate plasma between the first and second electrodes.

12. The substrate treating apparatus of claim 11, wherein the moving unit comprises:
a moving arm configured to the plasma supply unit in the second direction.

13. The substrate treating apparatus of claim 12, wherein the moving unit comprises:
a rotation shaft configured to rotate the support part.

14. The substrate treating apparatus of claim 1, wherein the dry-type treating part is disposed adjacent to the support part, the dry-type treating part further comprising:
a moving unit configured to move the plasma supply unit to the top of the substrate when plasma is supplied and to make the plasma supply unit run away from the top of the substrate when supply of the plasma is stopped, and wherein the wet-type treating part is disposed to adjacent to the support part,
the wet-type treating part comprising:
a chemical nozzle configured to supply a chemical onto the substrate loaded on the support part; and
a moving arm configured to move the chemical nozzle to the top of the substrate when a chemical is supplied and to make the chemical nozzle run away from the top of the substrate when supply of the chemical is stopped.

15. The substrate treating apparatus of claim 14, further comprising:
a drying part for supplying a dry gas onto the substrate to dry the substrate,
wherein the drying part comprises:
a dry nozzle configured to supply a dry gas onto the substrate loaded on the support part; and
a moving arm configured to move the dry nozzle to the top of the substrate when a dry gas is supplied and to make the dry nozzle run away from the top of the substrate when supply of the dry gas is stopped.

* * * * *